(12) United States Patent
Chaji

(10) Patent No.: US 10,847,743 B2
(45) Date of Patent: *Nov. 24, 2020

(54) ELECTRODE CONTACTS

(71) Applicant: Ignis Innovation Inc., Waterloo (CA)

(72) Inventor: Gholamreza Chaji, Waterloo (CA)

(73) Assignee: IGNIS INNOVATION INC., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,896

(22) Filed: Aug. 26, 2019

(65) Prior Publication Data

US 2019/0379004 A1    Dec. 12, 2019

Related U.S. Application Data

(63) Continuation of application No. 15/973,696, filed on May 8, 2018, now Pat. No. 10,439,159, which is a continuation of application No. 15/793,032, filed on Oct. 25, 2017, now abandoned, which is a continuation of application No. 15/296,424, filed on
(Continued)

(51) Int. Cl.
*H01L 51/52* (2006.01)
*H01L 51/00* (2006.01)
*H01L 27/32* (2006.01)

(52) U.S. Cl.
CPC ...... *H01L 51/5212* (2013.01); *H01L 27/3248* (2013.01); *H01L 51/0021* (2013.01); *H01L 51/5209* (2013.01); *H01L 51/5215* (2013.01); *H01L 51/5225* (2013.01); *H01L 51/5228* (2013.01); *H01L 51/5234* (2013.01); *H01L 2251/5315* (2013.01)

(58) Field of Classification Search
CPC ............. H01L 51/5212; H01L 51/5228; H01L 51/5225; H01L 51/5215; H01L 51/5234; H01L 51/5209; H01L 51/0021; H01L 27/3248; H01L 2251/5315
See application file for complete search history.

(56) References Cited

U.S. PATENT DOCUMENTS 6,197,181 B1 * 3/2001 Chen .................. H01L 21/2885
                                              204/198
2005/0164464 A1 * 7/2005 Hecht .................. C23C 16/045
                                              438/386

(Continued)

*Primary Examiner* — Sitaramarao S Yechuri
(74) *Attorney, Agent, or Firm* — Stratford Managers Corporation

(57) ABSTRACT

A device structure providing contact to conductive layers via a deep trench structure is disclosed. The device includes a first dielectric layer including a first opening. A first conductive layer is deposited over the first dielectric layer and the first opening. A second dielectric layer is deposited on the first conductive layer. The second dielectric layer includes a second opening. A second conductive layer is deposited over the second dielectric layer and the first and second openings. A semiconductor layer is deposited on the second dielectric layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

22 Claims, 5 Drawing Sheets

Related U.S. Application Data

Oct. 18, 2016, now Pat. No. 9,831,462, which is a continuation of application No. 14/581,193, filed on Dec. 23, 2014, now Pat. No. 9,502,653.

(60) Provisional application No. 61/929,699, filed on Jan. 21, 2014, provisional application No. 61/920,732, filed on Dec. 25, 2013.

(56) References Cited

U.S. PATENT DOCUMENTS

| | | | | |
|---|---|---|---|---|
| 2007/0096647 A1* | 5/2007 | Choo | H01L 29/78669 | 313/512 |
| 2009/0011592 A1* | 1/2009 | Uno | H01L 21/3065 | 438/623 |
| 2009/0170282 A1* | 7/2009 | Dong | H01L 21/76224 | 438/435 |
| 2010/0022099 A1* | 1/2010 | Van Nooten | C23C 16/045 | 438/758 |
| 2010/0060153 A1* | 3/2010 | Uchida | H01L 51/5048 | 313/504 |
| 2012/0139015 A1* | 6/2012 | Yu | H01L 21/28518 | 257/288 |
| 2014/0346484 A1* | 11/2014 | Nendai | H01L 51/5228 | 257/40 |

* cited by examiner

ELECTRODE CONTACTS

CROSS-REFERENCE TO RELATED APPLICATION

This application is a continuation of U.S. patent application Ser. No. 15/793,696, filed May 8, 2018, now allowed, which is a continuation of U.S. patent application Ser. No. 15/793,032, filed Oct. 25, 2017, which is a continuation of U.S. patent application Ser. No. 15/296,424, filed Oct. 18, 2016, now U.S. Pat. No. 9,831,462, which is a continuation of application Ser. No. 14/581,193 filed Dec. 23, 2014, now U.S. Pat. No. 9,502,653, which claims the benefit of U.S. Provisional Patent Application Nos. 61/929,699, filed Jan. 21, 2014, and 61/920,732, filed Dec. 25, 2013, each of which is hereby incorporated by reference in its entirety.

TECHNICAL FIELD

In array devices with a common-electrode, the resistance of the common electrode can affect the quality of the device performance. In the case of top emission displays, the top electrode needs to be transparent. One method to fabricate a transparent electrode is to use very thin electrodes. However, this results in higher resistivity which can be an issue for large area devices. In one method, the top electrode can be contacted to a conductive layer. However, developing a contact opening is very challenging since a shadow mask needs to be used to remove the semiconductor layer from the opening.

Thus, there is a need of developing contact to conductive layers without using a shadow mask for common-electrode devices. There is also a need to reduce the resistivity of an electrode to prevent a large voltage drop in a device.

SUMMARY

According to one example, a device structure providing contact to conductive layers via a deep trench structure is disclosed. The device structure includes a first dielectric layer including a first opening. The first opening has walls on the first dielectric layer. A first conductive layer is deposited over the first dielectric layer and the first opening. A second dielectric layer is deposited on the first conductive layer. The second dielectric layer includes a second opening having walls on the second dielectric layer. A second conductive layer is deposited over the second dielectric layer and the first and second openings. A semiconductor layer is deposited on the second dielectric layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

Another example is a method of method of fabricating a device structure providing contact to conductive layers via a deep trench structure. The method includes depositing a first dielectric layer and creating a first opening in the first dielectric layer. The first opening has walls on the first dielectric layer. A first conductive layer is deposited over the first dielectric layer and the first opening. A second dielectric layer is deposited on the first conductive layer. A second opening is created on the second dielectric layer. The second opening has walls on the second dielectric layer. A second conductive layer is deposited over the second dielectric layer and the first and second openings. A semiconductor layer is deposited on the second dielectric layers such that the semiconductor layer is not continuous on at least part of the walls of the first or second opening. A top electrode layer is deposited on the semiconductor layer. The top electrode is in contact with the second conductive layer on at least part of the walls of the first or second opening.

Another example is a low resistance device including a backplane layer and a low resistance conductor layer having a pattern with a plurality of edges on the backplane layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Another example is a method of forming a low resistance device. The method includes forming a backplane and depositing a low-resistance conductive layer on the backplane. The low-resistance conductive layer is patterned to create a plurality of edges in the low-resistance conductive layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages of the invention will become apparent upon reading the following detailed description and upon reference to the drawings.

Figure 1:
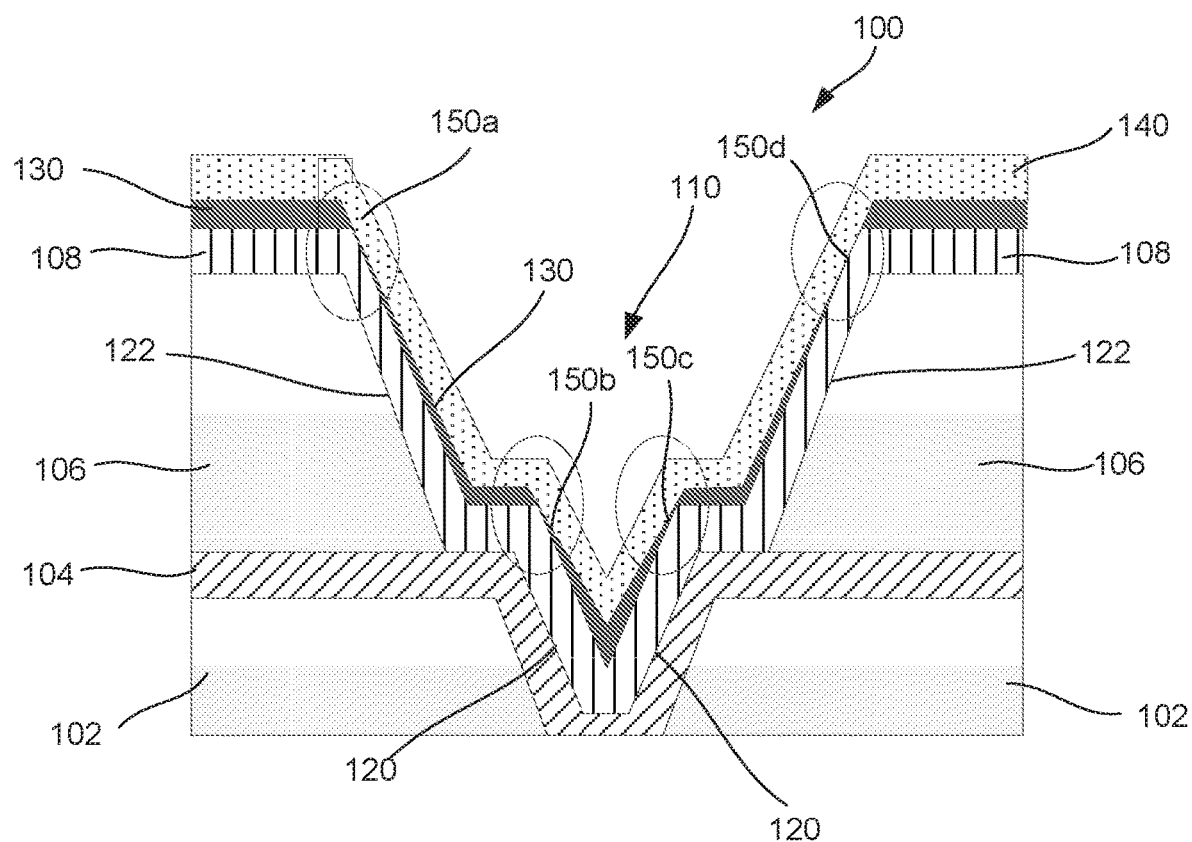
FIG. 1 is a cross-sectional view of a semiconductor device structure with contacts to a common electrode.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is a cross-section view of an example structure to allow connection of a top electrode to electrodes. The structure 100 in FIG. 1 may be part of a semi-conductor device including transistors and other components requiring electrical connection. The structure 100 includes a first dielectric layer 102. A first conductive layer 104 is formed on the first dielectric layer 102. A second dielectric layer 106 is formed on the first conductive layer 104. A deep trench 110 is formed in the dielectric layers 102 and 106. A second conductive layer 108 is formed over the second dielectric layer 106.

As may be seen in FIG. 1, the trench 110 bisects the first dielectric layer 102 and the conductive layer 102 is located over sidewalls 120 of the first dielectric layer 102. The second conductive layer 108 is located over sidewalls 122 of the second dielectric layer 106 and also may be in contact with the first conductive layer 104.

A semiconductor layer 130 may be fabricated over the second conductive layer 108 and partially over the walls of the trench 110 that are covered by the second conductive layer 108. A top electrode layer 140 is formed over the semiconductor layer 130. The electrode layer 140 is formed on the walls of the trench 110. The electrode layer 140 contacts the second conductive layer 108 at certain points on the walls of the trench 110 such as at contact points 150a, 150b, 150c and 150d in this example.

In most of the cases, one of the dielectric layers 102 or 106 can be used as the deep trench 100. A deep opening is created by the trench 110 so it causes a discontinuity in the semiconductor (or selected dielectric) layer 130. For example, in top emission displays, one of the dielectric layers acts as a planarization layer which needs to be very thick as shown by the second dielectric layer 106. Thus, this layer is a good candidate for the deep trench structure. To create an even deeper trench, multiple stacked openings in the backplane can be used. For example, FIG. 1 shows a deep trench created in the backplane by using two openings. To create the openings, different patterning techniques such lithography, liftoff, or molding, shadow masking and/or other techniques can be used.

For depositing the dielectric, conductive and semiconductor layers, different techniques such as plasma enhanced chemical vapor deposition (PECVD), chemical vapor deposition (CVD), sputtering, vapor deposition, printing, spin coating, spray coating, and others can be used.

Figure 2A:
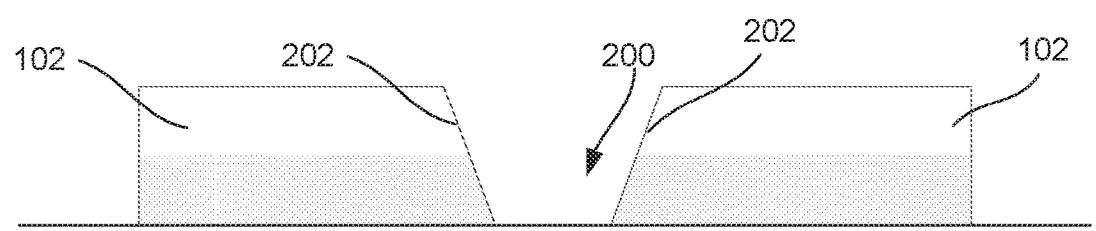
FIGS. 2A-2G are diagrams showing the process of fabricating the device structure in FIG.

One example of developing a deep trench connection in a structure 100 using multiple dielectric layers is shown in FIGS. 2A-2F as described below. FIG. 2A shows the deposition of the dielectric layer 102. In this example, the dielectric layer 102 may be a material such as Silicon-Nitride which is deposited on top of existing structure on the backplane. This may be one of the backplane dielectric layers or an extra layer. An opening 200 in the dielectric layer 102 in the position of the eventual deep-trench 110 in FIG. 1 using photolithography. The opening 200 is driven to depth of the backplane and therefore creates sidewalls 202.

Figure 2B:
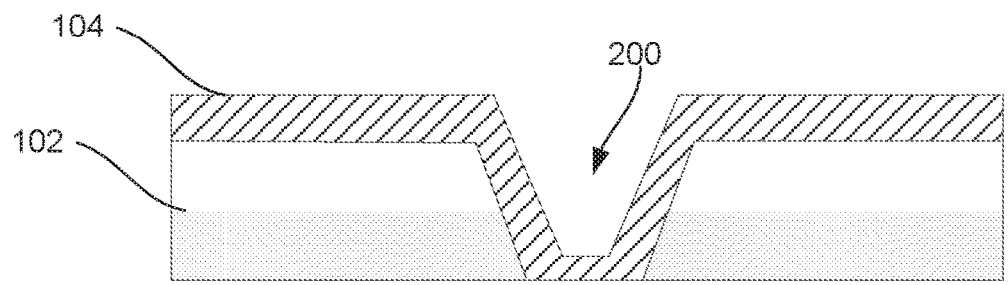

The conductive layer 104 is then deposited over the remaining dielectric layer 102 as shown in FIG. 2B. The conductive layer 104 is deposited over the flat top surfaces of the dielectric layer 102 and the sidewalls 202. The conductive layer 104 may be one of the backplane conductive layers or an extra layer. In this example, the conductive layer 104 is patterned as required by the design (a pattern should be left on top of the opening 200).

Figure 2C:
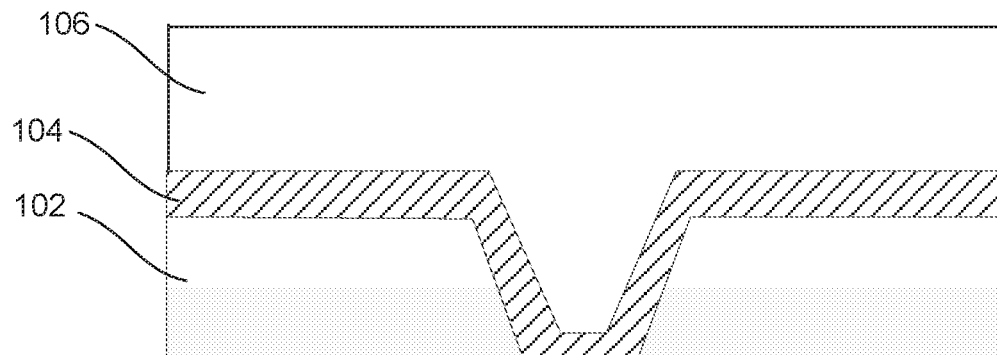

FIG. 2C shows the deposition of the second dielectric layer 106 over the conductive layer 104. The second dielectric layer 106 may be a polymer layer deposited by spin (spray or printing) coating, or it may be a stack of non-organic and polymer layers or non-organic only). This layer can be one of the layers required for the display structure such as planarization layer, or it can be an extra layer added only for the trench development. In this example, the second dielectric layer 106 is relatively thick, thus allowing the creating of the deep trench 110. The second dielectric layer 106 may be patterned using conventional photolithography (molding or other techniques can be used as well). The pattern of the second dielectric layer 106 includes a second opening in the position of the deep trench 110.

Figure 2D:
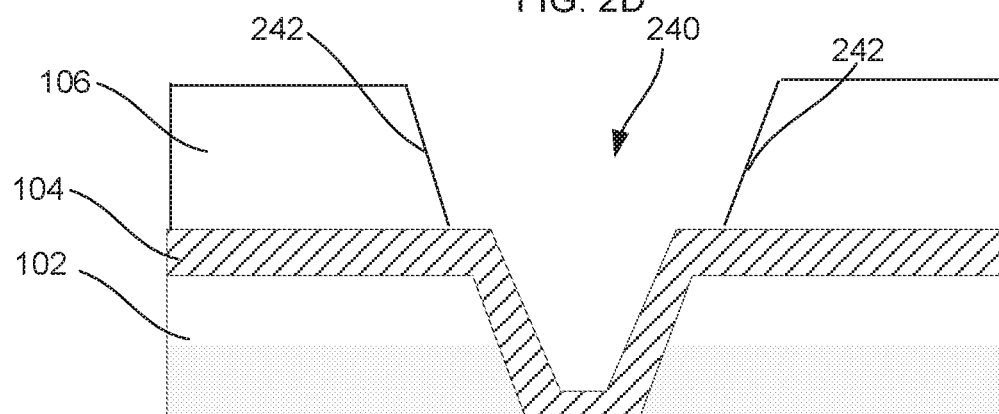

FIG. 2D shows the creation of a second opening 240 which is formed through patterning the second dielectric layer 106. The second opening 240 allows sidewalls 242 to be formed in the second dielectric layer 106. The second opening 240 allows the second dielectric layer 106 to be removed so the conductive layer 104 is exposed. The second opening 240 thus creates trench walls 122 shown in FIG. 1. The combination of the first opening 200 and the second opening 240 create the deep trench 110 and corresponding side walls 120 and 122 in FIG. 1.

Figure 2E:
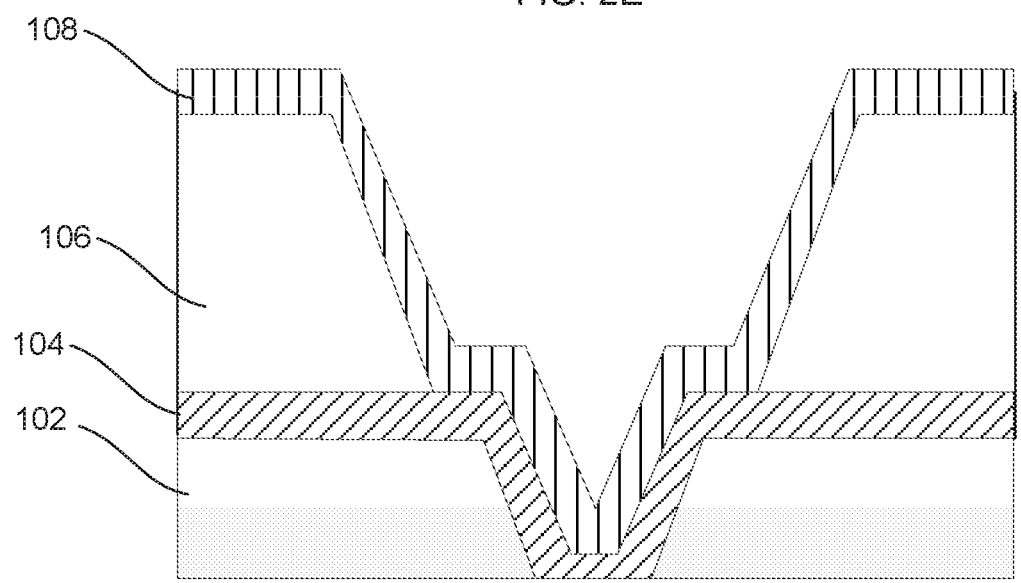

FIG. 2E shows the deposition of the second conductive layer 108 over the trench created in the second dielectric layer 106. The second conductive layer 108 may be one of the display conductive layers such as the OLED anode layer or an extra layer added for the deep trench development. The conductive layer 108 is patterned as required by the design of the device structure. The pattern of the conductive layer 108 includes leaving the conductive layer 108 on the first opening 200.

Figure 2F:
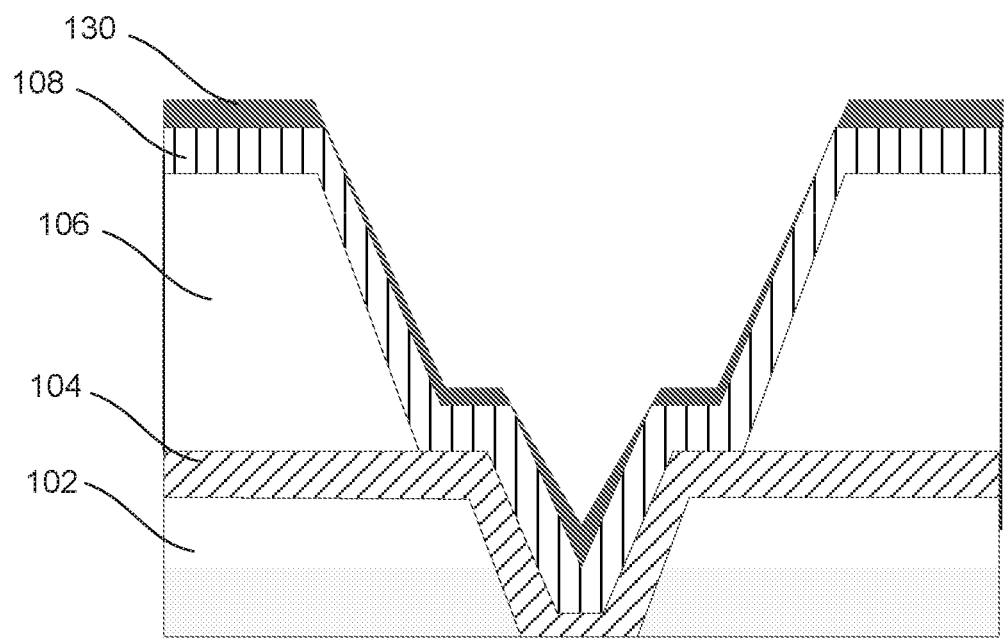

FIG. 2F shows the deposition of the semiconductor layer 130 on the second conductive layer 108. The semiconductor layer 130 may be an OLED structure or other thin film device structure. The semiconductor layer 130 may be deposited with different techniques such as vapor deposition, printing, etc. Since the semiconductor layer 130 is very thin compared to the depth of the trench 110 and the walls 122 of the trench are steep, there will be a discontinuity such as the contact point 150a in the semiconductor layer 130 on the walls 122 and edge of the trench 110.

Figure 2G:
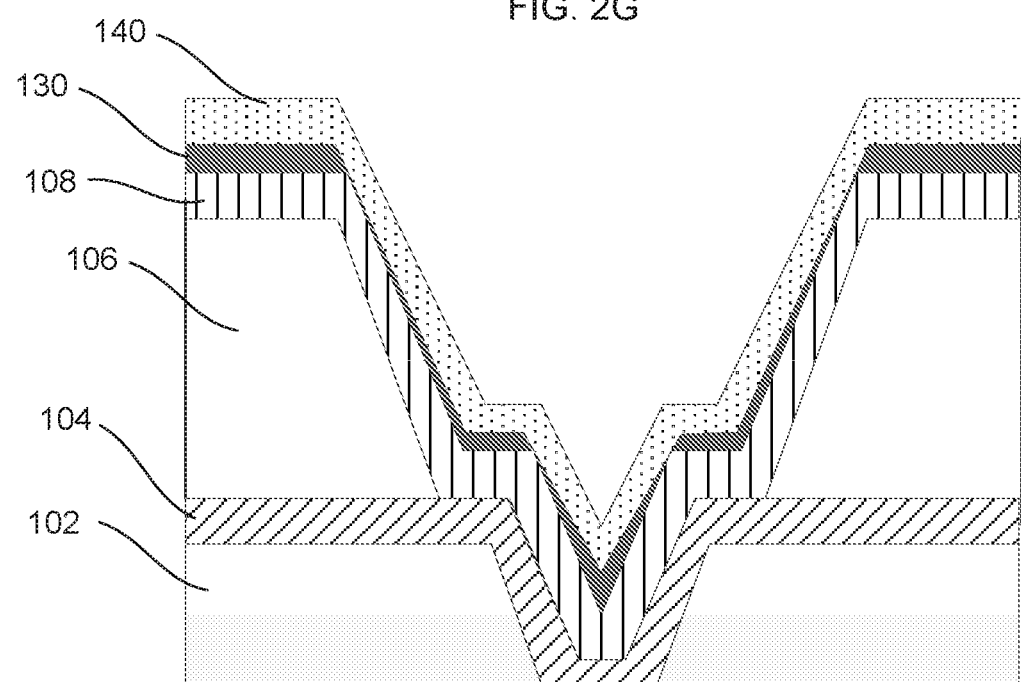

FIG. 2G shows the deposition of the top electrode 140. The top electrode 140 connects to the second conductive layer 108 at the discontinuity areas of the semiconductor layer 130. FIG. 1 shows a number of discontinuity areas 150a, 150b, 150c and 150d which allow contact between the top electrode 140 and the second conductive layer 108.

In the case of a deep trench, the semiconductor (or a dielectric) layer 130 is discontinued at the edges (or walls of the trench). Therefore, after depositing the top electrode 140, the top electrode 140 is connected to the conductive layers 108 at the walls of the trench 110. In this manner, a shadow mask may be avoided to create the contact since the semiconductor layer has discontinuities due to the trench that allows contact.

Figure 3:
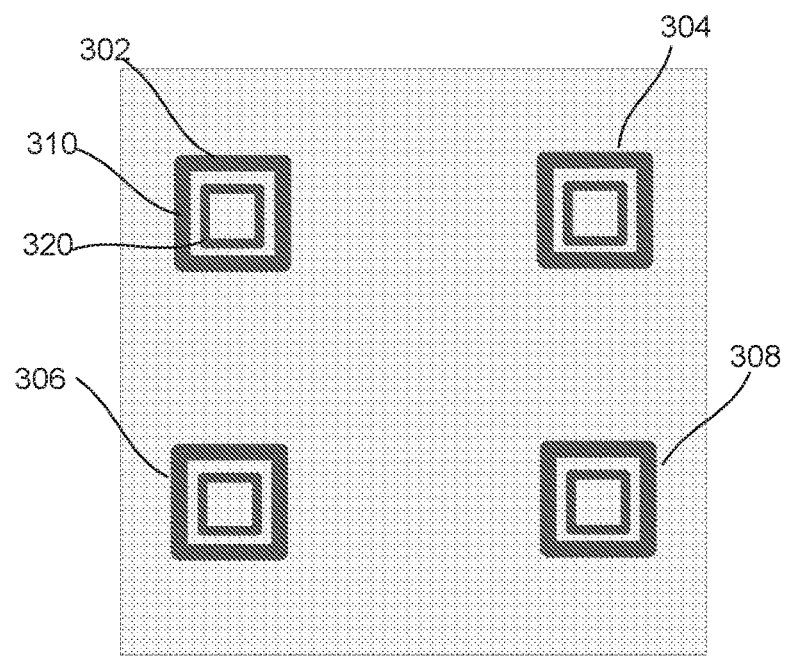
FIG. 3 is a top plan view of the common electrodes in several of the devices having a structure as shown in FIG. 1, showing the contact areas to the conductive layers in each device.

FIG. 3 demonstrates a top view of a device 300 that includes top electrodes 302, 304, 306 and 308. Each of the top electrodes are fabricated in the process described above. The top electrode 302 includes an outer contact area 310 which corresponds to the trench walls in FIG. 1. The outer contact area 310 is at the edge of the trench structure where there is a discontinuity of the semiconductor layer 130 in FIG. 1. An inner contact area 320 also provides contact to the electrode 108 at a discontinuity of the semiconductor layer 130 in FIG. 1. Thus, the top electrodes 302, 304, 306 and 308 are connected to the conductive layers at the discontinuity areas of the semiconductor layers in a trench 110.

When there are thin layers of semiconductor (dielectric) between two conductive layers to form a device, a dielectric layer is used to cover the edge of the bottom conductive layer. For example, an OLED can consist of thin organic layers (with a total thickness of a few 100 nm) which are sandwiched between two conductive layers (at least one of which is transparent). Since the thickness of the bottom conductive layer is significantly more than that of the organic layers, to avoid any short, a dielectric is deposited on the bottom electrode and is patterned in a way that covers the edge of the bottom electrode and leaves the center of the electrode exposed for organic layers.

In some cases, the resistance for one of the conductive layers (electrode) is high, causing a significant voltage drop in the case of an array structure. For example, in the case of a top-emission OLED, the top electrode is transparent and is made of very thin conductive layers.

Figure 4:
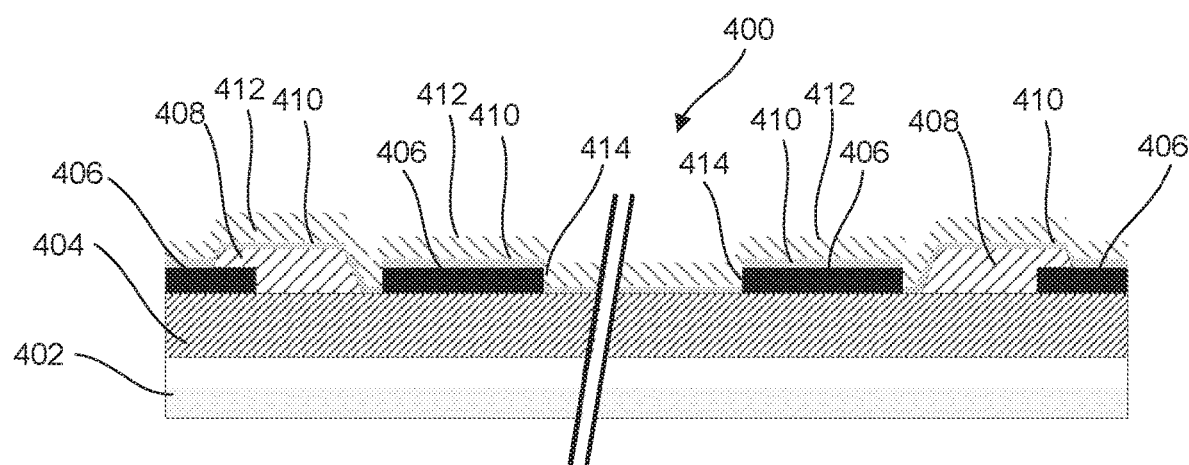
FIG. 4 is a sectional view of a crossing structure for improving the resistance of an electrode.

In order to prevent a significant voltage drop, a lower resistance conductive material may be used before depositing the semiconductor layers. FIG. 4 shows a cross section of a device structure 400 that avoids a significant voltage drop from resistance of one of the conductive layers. In this example, a substrate 402 supports a dielectric layer 404 which serves as a backplane of the device structure 400. The dielectric layer 404 may have numerous other layers that make up the backplane of the device. A series of lower resistance conductive strips 406 is formed on the dielectric layer 404. In this example, the lower resistance conductive strips 406 are patterned such that they have numerous edges. A dielectric layer 408 is formed on some of the conductive strips 406. A thin semiconductor layer 410 which may be an organic material is formed over the horizontal surfaces of the low resistance conductive strips 406 and the dielectric layers 408. As may be seen in FIG. 4, the edges of the lower resistance conductive strips 406 remain exposed and not covered by the semiconductor layer. A top conductive layer 412 is then applied which in this example is transparent but has a high resistance. The top conductive layer 412 is in contact with the lower resistance conductive strips 406 on an edge such as on edges 414 thus shorting out the top conductive layer 412 and lowering the resistance of the contact.

The process of creating the structure in FIG. 4 is based on using lower resistance conductive material for the conductive strips 406 before depositing the semiconductor (dielectric) layers. A low-resistance conductive layer (or stack of conductive layers) is deposited which is thicker than the main semiconductor (dielectric) layers being deposited on top of it. This may be one of the conductive layers existing in the device or a new one added just for this reason. The low resistance conductive layer is then patterned. The pattern should create more edges. For example, stripes such as shown in FIGS. 4 and 5A or a mesh shown in FIG. 5B may create numerous edges.

If there are other layers before the main semiconductor layer, they should be patterned after deposition to leave the edges exposed. For example, in FIG. 4, the dielectric layers 408 are patterned on the low resistance conductive strips 406. The main semiconductor (dielectric) layer 410 is then deposited and patterned as needed by the design. The high-resistance conductive layer 412 is then deposited and patterned as needed. The pattern covers the low-resistance area of the conductive strips 406 and, more importantly, at least one of its edges. The fabrication of device is continued until all the other required layers after this high-resistance conductive layer are deposited and patterned.

The edge or low-resistance conductive material cannot be covered by the main semiconductor (dielectric) since the thickness of the conductive layer is greater than that of the main layer. The high-resistance conductive layer will be shorted to the exposed edge of the low-resistance conductive layer.

Figure 5A:
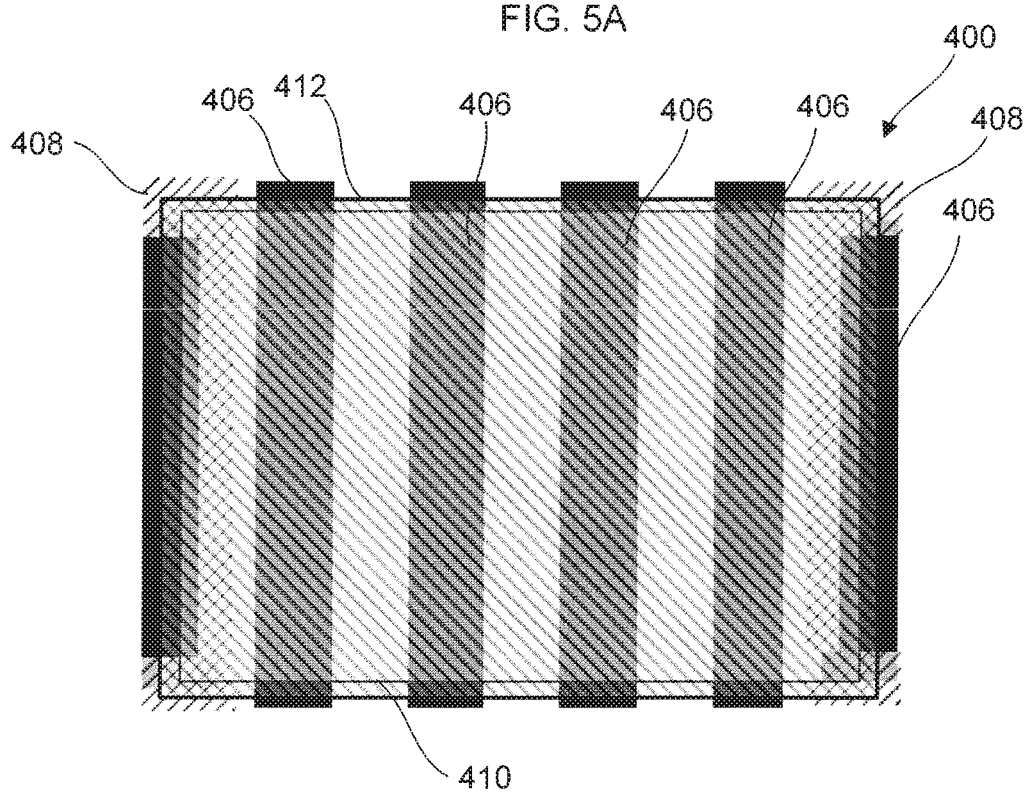
FIG. 5A is a side elevation of a crossing structure for improving the resistance with strip patterning.
Figure 5B:
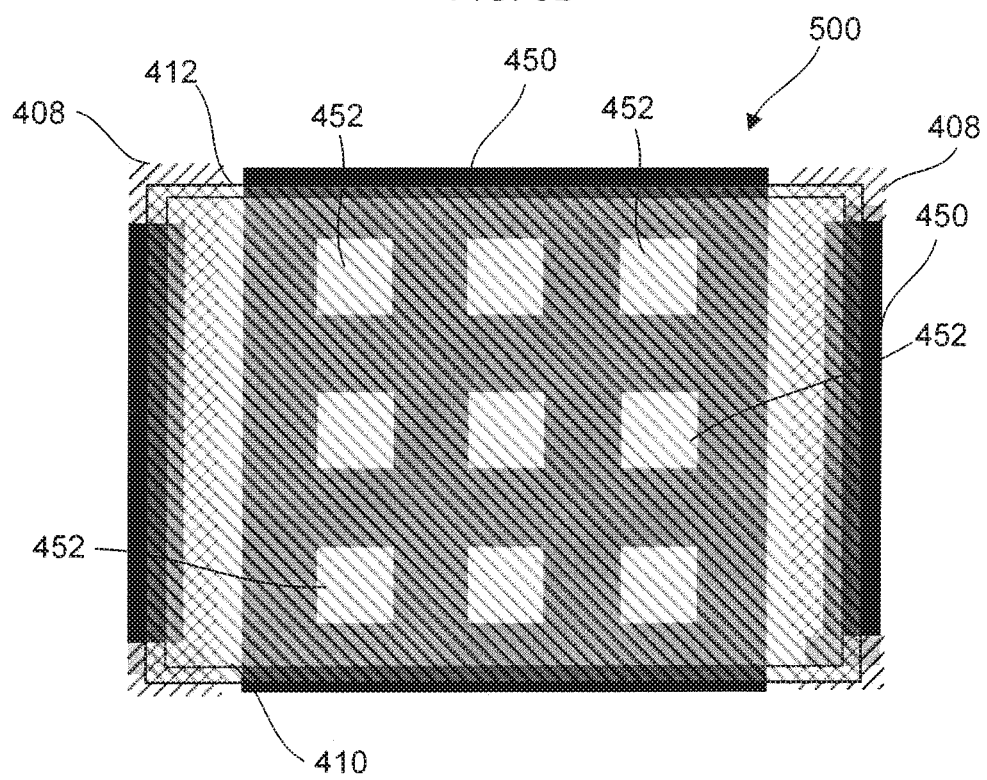
FIG. 5B is a side elevation of another crossing structure for improving the resistance with mesh patterning.

FIGS. 5A and 5B are top plan views of examples of the structure that incorporates the low resistance conductive layers. FIG. 5A shows a top view of the device structure 400 in FIG. 4. The top conductive layer 412 is a transparent layer with high resistance. Since the top conductive layer 412 is deposited over the low resistance conductive strips 406, it contacts the edges of the strips 406 and is shorted to prevent high resistance. The semiconductor layer 410 is fabricated over the conductive strips as well as other layers 408.

FIG. 5B is a top view of another device structure 500 that has the same top conductive layer 412, semiconductor layer 410 and other layers 408 as the structure 400 in FIG. 4. A low resistive conductive layer 450 is patterned in a mesh structure. The low resistive conductive layer 450 has a series of openings 452 that have multiple edges to create contact with the high resistance top conductive layer 412 thus shorting the top conductive layer 412.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A device structure comprising:
   a material structure including a top surface and a side wall integral with and joining the top surface, the material structure comprising a first conductive layer forming the side wall including a first portion and a second portion of the sidewall;
   at least one material layer deposited on the material structure, the at least one material layer being continuous on the top surface of the material structure, continuously covering the first portion of the side wall, and having at least one discontinuity on the second portion of the side wall; and
   a second conductive layer deposited on the at least one material layer, the second conductive layer in contact with the material structure on the second portion of the side wall and separated from the material structure by the at least one material layer on the first portion of the side wall, the at least one material layer comprising material different from a material of the second conductive layer.

2. The device structure of claim 1, wherein the first conductive layer forms the top surface of the material structure.

3. The device structure of claim 1, wherein the at least one material layer prevents electrical contact between the first and second conductive layers on the first portion of the side wall.

4. The device structure of claim 1, wherein the at least one discontinuity in the at least one material layer provides electrical contact between the first and second conductive layers on the second portion of the side wall.

5. The device structure of claim 1, wherein the side wall is created by one of lithography, lift off, moulding or shadow masking.

6. The device structure of claim 1, wherein the at least one material layer is part of an organic light emitting diode structure.

7. The device structure of claim 1, wherein the material structure comprises at least one of a silicon-nitride dielectric layer and a polymer dielectric layer.

8. The device structure of claim 1, wherein the material structure comprises at least one layer, and wherein the at least one layer of the material structure, the first conductive layer, the second conductive layer, and the at least one material layer are deposited via at least one of PECVD, CVD, sputtering, vapor deposition, printing, spin coating, and spray coating.

9. The device structure of claim 1, wherein the first portion of the side wall comprises a lower portion of the side wall and the second portion of the side wall comprises a portion of the side wall between the lower portion of the side wall and the top surface.

10. The device structure of claim 1, wherein the at least one material layer comprises at least one of a semiconductor layer and a dielectric layer.

11. A method of fabricating a device structure, the method comprising:
    fabricating a material structure including a top surface and a side wall integral with and joining the top surface, the material structure comprising a first conductive layer forming the side wall including a first portion and a second portion of the sidewall;
    depositing at least one material layer on the material structure, the at least one material layer being continuous on the top surface of the material structure, continuously covering the first portion of the side wall, and having at least one discontinuity on the second portion of the side wall; and
    depositing a second first conductive layer on the at least one material layer, the second first conductive layer in contact with the material structure on the second portion of the side wall and separated from the material structure by the at least one material layer on the first portion of the side wall, the at least one material layer comprising material different from a material of the second first conductive layer.

12. The method of claim 11, wherein fabricating the material structure comprises depositing the first conductive layer such that it forms the top surface of the material structure.

13. The method of claim 11, wherein the at least one material layer is deposited such that the at least one material layer prevents electrical contact between the first and second conductive layers on the first portion of the side wall.

14. The method of claim 11, wherein the at least one material layer is deposited such that the at least one discontinuity in the at least one material layer provides electrical contact between the first and second conductive layers on the second portion of the side wall.

15. The method of claim 11, wherein the side wall is fabricated at least in part by one of lithography, lift off, moulding or shadow masking.

16. The method of claim 11, wherein the at least one material layer is part of an organic light emitting diode structure.

17. The method of claim 11, wherein the material structure comprises at least one of a silicon-nitride dielectric layer and a polymer dielectric layer.

18. The method of claim 11, wherein the material structure comprises at least one layer, and wherein the at least one layer of the material structure is fabricated at least partly via, and the first conductive layer, the second conductive layer, and the at least one material layer are deposited via, at least one of PECVD, CVD, sputtering, vapor deposition, printing, spin coating, and spray coating.

19. The method of claim 11, wherein the first portion of the side wall comprises a lower portion of the side wall and the second portion of the side wall comprises a portion of the side wall between the lower portion of the side wall and the top surface.

20. The method of claim 11, wherein the at least one material layer comprises at least one of a semiconductor layer and a dielectric layer.

21. A device structure comprising:
    a material structure including a top surface and a side wall integral with and joining the top surface;
    at least one material layer deposited on the material structure, the at least one material layer being continuous on the top surface of the material structure, continuously covering a first portion of the side wall, and having at least one discontinuity on a second portion of the side wall; and
    a first conductive layer deposited on the at least one material layer, the first conductive layer in contact with the material structure on the second portion of the side wall and separated from the material structure by the at least one material layer on the first portion of the side wall, the at least one material layer comprising material different from a material of the first conductive layer, wherein the first portion of the side wall comprises a lower portion of the side wall and the second portion of the side wall comprises a portion of the side wall between the lower portion of the side wall and the top surface.

22. A method of fabricating a device structure, the method comprising:
    fabricating a material structure including a top surface and a side wall integral with and joining the top surface;
    depositing at least one material layer on the material structure, the at least one material layer being continuous on the top surface of the material structure, continuously covering a first portion of the side wall, and having at least one discontinuity on a second portion of the side wall; and
    depositing a first conductive layer on the at least one material layer, the first conductive layer in contact with the material structure on the second portion of the side wall and separated from the material structure by the at least one material layer on the first portion of the side wall, the at least one material layer comprising material different from a material of the first conductive layer, wherein the first portion of the side wall comprises a lower portion of the side wall and the second portion of the side wall comprises a portion of the side wall between the lower portion of the side wall and the top surface.

* * * * *